(12) United States Patent
Kitazume

(10) Patent No.: US 6,893,709 B2
(45) Date of Patent: May 17, 2005

(54) METAL MASK STRUCTURE AND METHOD FOR MANUFACTURING THEREOF

(75) Inventor: Eiichi Kitazume, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 463 days.

(21) Appl. No.: 09/934,845

(22) Filed: Aug. 23, 2001

(65) Prior Publication Data

US 2002/0025406 A1 Feb. 28, 2002

(30) Foreign Application Priority Data

Aug. 25, 2000 (JP) ........................................ 2000-255781

(51) Int. Cl.⁷ .............................................. B32B 23/02
(52) U.S. Cl. ........................ 428/192; 428/131; 428/198
(58) Field of Search ............................... 428/131–133, 428/136, 192, 198, 209

(56) References Cited

U.S. PATENT DOCUMENTS

| | | | | |
|---|---|---|---|---|
| 3,769,908 A | * | 11/1973 | Griffin | .......................... 101/27 |
| 3,955,021 A | * | 5/1976 | Cleavenger | ................... 428/81 |
| 4,915,658 A | * | 4/1990 | Lopata et al. | ................. 445/30 |
| 5,318,855 A | * | 6/1994 | Glovatsky et al. | .......... 428/457 |
| 5,373,786 A | * | 12/1994 | Umaba | ........................ 101/127 |

FOREIGN PATENT DOCUMENTS

| | | | |
|---|---|---|---|
| JP | 61-296728 A | 12/1986 | |
| JP | 10-041069 | 2/1998 | ........... H05B/33/10 |

* cited by examiner

Primary Examiner—Cathy F. Lam
(74) Attorney, Agent, or Firm—McGuireWoods LLP

(57) ABSTRACT

A metal mask structure in which a metal mask 12 for depositing a thin layer is welded to a support frame 11 and the welding portion is placed within at least a substrate to be deposited, characterized in that a concave part 12a is formed on an opposite surface of a surface of said metal mask which is contacted to the frame, and the metal mask and the support frame are welded to each other within the concave part.

15 Claims, 4 Drawing Sheets

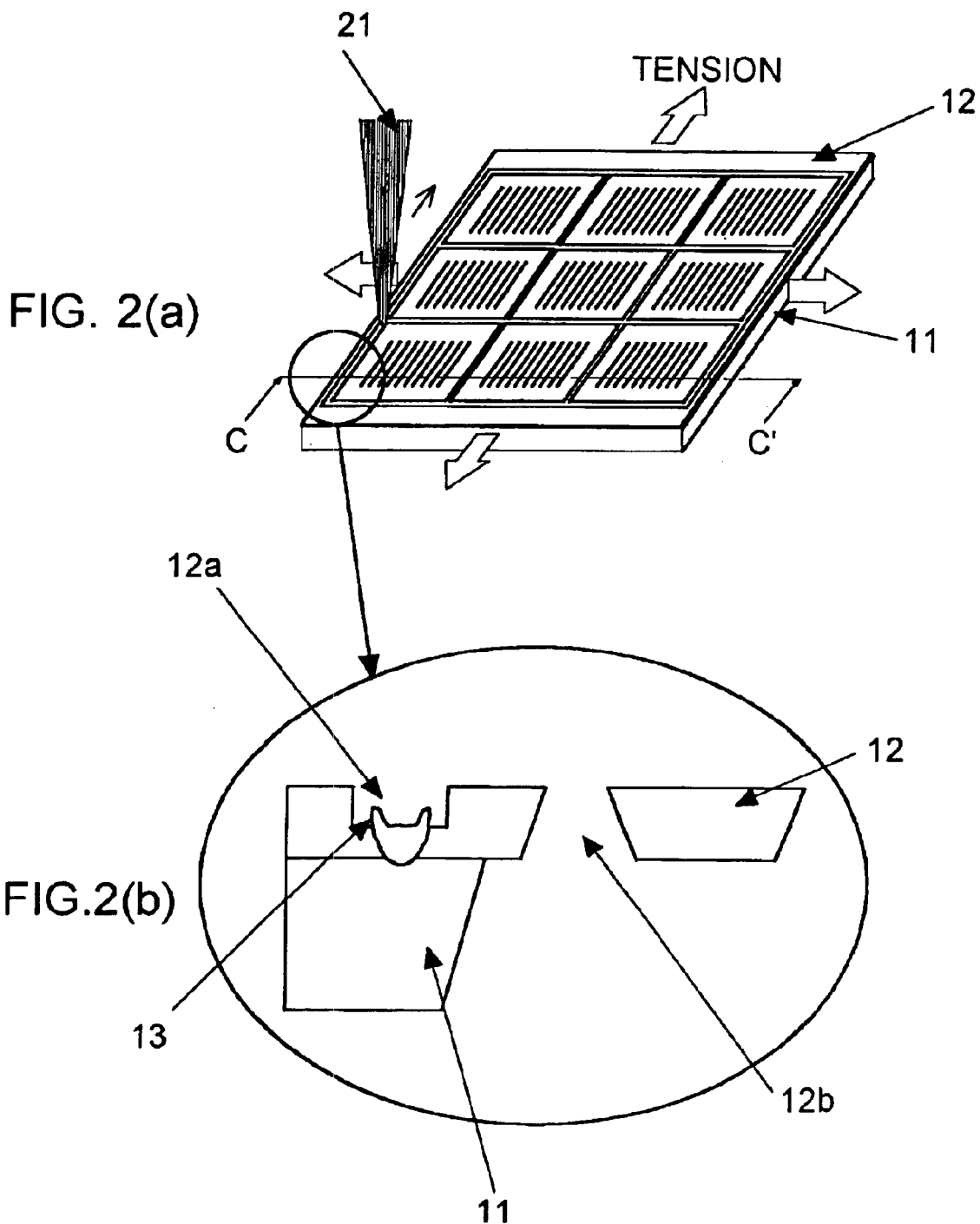

METAL MASK STRUCTURE AND METHOD FOR MANUFACTURING THEREOF

BACKGROUND OF THE INVENTION

1. Field of the Invention

The present invention relates to a structure of a metal mask for depositing a deposit with the metal mask intimately held on a substrate and to a method for manufacturing thereof.

2. Description of the Related Art

In an organic electroluminescent device (an organic EL device) used for such as a display device or a flat panel display, electrons which are injected from a cathode and holes which are injected from an anode are recombined within an organic fluorescent dye interposed between both electrodes, in order to excite the dye for obtaining the luminescence. Therefore, this device attracts attention because this device has some excellent characteristics as compared with a liquid crystal display (LCD), that is, for example, an angle of visibility is large, a high contrast can be easily realized at the high brightness, miniaturization of the device can be achieved since a back light is not required due to the employment of the spontaneous emission of the dye and an extremely thin panel having a thickness below two millimeters can be realized, and further, this device is suitable for an application such as dynamic images reproduction because its response time is much shorter than that of the LCD.

Colorization of such an organic EL device is also under scrutiny, for example, a parallel type independent system in which three colors of RGB pixels are formed of different luminescent layers containing different dyes respectively, a color conversion system in which the light generated from one kind of blue luminescent layer is converted to three colors of RGB after passing through a fluorescent color conversion film, and a color filter system in which the light from a white luminescent layer is passed through a color filter for obtaining the three colors of RGB are known.

In the color conversion system or in the color filter system, only one luminescent layer is needed, so that the patterning of the luminescent layer is not required. Also, a color conversion film or a color filter which requires to be patterned can be achieved by a conventional lithographic method, but there is a problem that a luminous efficiency decreases through the color conversion film or the color filter.

On the other hand, the parallel type independent system is advantageous as compared with other types, because this system has a characteristic that the luminous efficiency is excellent due to the unnecessity of the color conversion film or the color filter. However, it is necessary to coat a fine luminescent layer for every each color and a high performance material is required to form each of the three colors of luminescent layers. In particular, an organic dye used for the luminescent layer is poor in resistance to moisture or organic solvents, so that patterning through a wetting process which is a representative of the photolithographic method is difficult to be performed. In addition, as for the electrodes which are formed on the organic luminescent layer, the organic dye is adversely affected by performing the pattern processing through the wetting process, so that in both cases, the dry process such as deposition is used and the patterning has been achieved by using a mask.

However, when a fine pattern is formed, a mask should be made thinner; otherwise the film thickness of a deposit around an opening becomes thinner, so that a deposit having an uniform thickness can not be obtained. Further, the deposition has to be performed with the mask intimately contacted to a substrate in order to perform the deposition with high precision. However, as the mask becomes thinner, the mask tends to be bent, so that a gap is formed between the mask and the substrate. Therefore, especially at a portion which is closer to the central portion, the gap becomes larger and the deposition pattern tends to be blurred. In addition, an increase in temperature causes expansion of the mask during the deposition and the thinner layer results in lack of mechanical rigidity, so that a slight vibration and stress result in to displacement of a line position of the mask, and the alignment with the metal mask becomes difficult to be performed in particular when multi-color luminescent layers are deposited. As described above, there has been a problem of how to ensure its precision.

In actual manufacturing, a plurality of EL device patterns are deposited at a time on one substrate, then the patterns are divided to an individual EL device. That is, the plurality of EL device patterns are deposited at a time on a large-sized glass substrate, so that the mask also becomes larger, and the mask tends to be further deflected. Therefore, the frame has conventionally been laid like a beam between EL device patterns and the metal mask has been welded and secured to the frame in order to resolve the deflection of the mask. In addition, it is an effective method as disclosed in a Japanese Patent Application Laid-Open No. 10-41069 that the mask is secured to the frame with tension applied thereto in order to allow the flatness of the mask to be in its ideal state.

Although various methods such as laser welding and spot welding are taken for welding the mask to the frame, a welding flash having a height of several $\mu$ms to several hundreds of $\mu$ms is generated on a mask surface which is contacted to the substrate during welding. As shown in FIG. 4(a), a typical deposition method is performed by torating the substrate with an evaporation source 48 displaced from a center position of the substrate 50. However, when the deposition is performed with this welding flash remained as it is, the welding flash 43 protrudes at a welding portion between the frame 41 and the mask 42 as shown in FIG. 4(b), so that a gap 44 is created between the substrate 45 and the mask 42. For example, when a luminescent layer 47 is deposited from one evaporation source 48 as shown in the same Figure, a deposition incidence angle at the farthest end of the deposition area from the evaporation source 48 and a deposition incidence angle at the nearest end of the deposition area from the evaporation source 48 become different. The deposition incidence angle at the farthest end of the deposition area is minimized, and at the farthest side from the center of the substrate, the deposition is performed in a larger area than a predetermined area (the same width as that of ITO). Further, it is necessary to allow a uniform part of the luminescent layer to correspond to the ITO electrode, but the uniform part may not correspond to the ITO electrode because a center of the uniform part of the luminescent layer which is formed at the nearest position from the evaporation source (deposition incidence angle is maximum (52)) and a center of the ITO electrode are displaced from each other due to the fact that the position which is closer to the center of the substrate is shaded with a slit. Further, when the luminescent layer is required to be coated for every each color in order to achieve full-colorization, the layer is formed with the same mask displaced by a pitch of ITO. However, at the end of the deposition area, the layer is deposited onto an adjacent pixel portion (an adjacent ITO electrode 46) at the farthest position from the center of the substrate. In particular, this tendency becomes significant as the pitch and space become narrower.

In case of adopting a method in which the welding flash is removed by such as grinding, welding peeling occurs by rubbing motion during the grinding and the mask will be deflected by radiation heat during the deposition, so that it may be impossible to form the fine patterns. In addition, when the mask is secured to the frame with the tension applied thereto, the pattern per se might often be deformed by the welding peeling. Therefore, it has been difficult to solve the above described problems since the deposition has usually been performed with the welding flash remained as it is.

SUMMARY OF THE INVENTION

Therefore, an object of the present invention is to provide a mask structure which can prevent a blur of the deposition pattern by minimizing the gap between the mask and the substrate being created by the welding flash, in case that the welding portion is contacted within a substrate to be deposited when the metal mask is welded to the frame.

As a result of devoting ourselves to solving the above described problems, the inventors has now found that a blur of a deposition pattern is virtually eliminated by forming a concave part in a welding portion between a metal mask and a frame and by securing and welding the metal mask and the frame within the concave part. This is because the height of a welding flash produced becomes lower and the flash barely protrudes from the surface of the mask to be contacted to the substrate, so that the substrate can intimately be contacted to the mask. Thus the present invention has been brought to completion. That is, the present invention relates to a metal mask structure in which a metal mask for depositing a thin layer is welded to a support frame, the welding portion being positioned within at least a substrate to be deposited, characterized in that a concave part is formed in a surface of said metal mask which is an opposite side of a surface of said metal mask to be contacted to the frame and that the metal mask and the support frame are welded to each other within the concave part.

According to the present invention, a welding flash can be made to a certain height within an acceptable range or a welding flash does not protrude from a surface of the mask to be contacted to a substrate to be deposited by welding a metal mask to a frame within a concave part provided in the metal mask, so that a gap caused by a welding flash decreases when the substrate to be deposited was intimately contacted to the mask or the substrate and the mask are able to intimately contacted to each other, therefore it become possible to prevent a blur of the deposits from occurring.

BRIEF DESCRIPTION OF THE DRAWINGS

FIGS. 1(a)–1(d) show an example of a metal mask and a frame which are used in the present invention, wherein FIG. 1(a) is a plan view of the frame, FIG. 1(b) is a sectional view taken along a line A–A' of the FIG. 1(a), FIG. 1(c) is a plan view of the metal mask, and FIG. 1(d) is a partial sectional view of a part enclosed with a circle on a line B–B' of the FIG. 1(c).

FIGS. 2(a) and 2(b) are illustrations of welding of the metal mask and the frame of the present invention, wherein FIG. 2(b) is a partial sectional view (after welding) of a part enclosed with a circle on a line C–C' of FIG. 2(a).

FIGS. 3(a) and 3(b) show a concept of an organic EL device described in the manufacturing example of the device according to the present invention, wherein FIG. 3(a) is a partial sectional view and FIG. 3(b) is a partially broken-out perspective view.

FIGS. 4(a) and 4(b) are illustrations of a problem caused by a conventional vapor-deposition, wherein FIG. 4(a) shows a concept of the vapor-deposition and FIG. 4(b) shows a typical sectional view.

DETAILED DESCRIPTION OF THE PREFERRED EMBODIMENTS

Figure 1A:
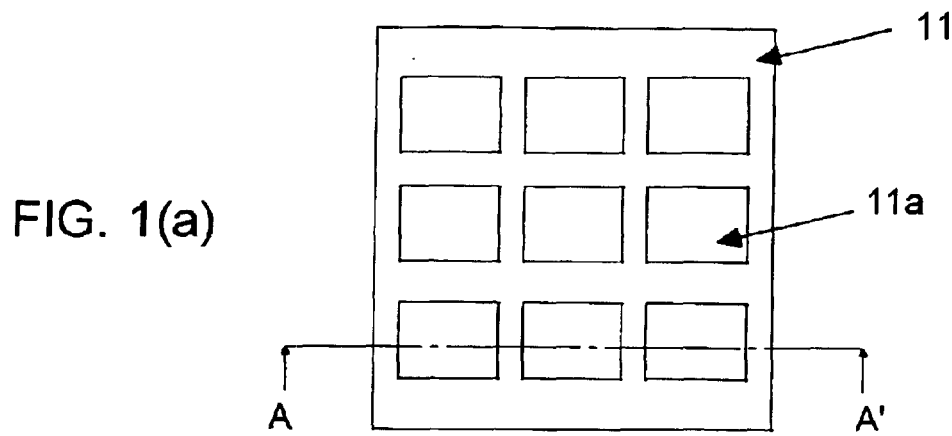

In order to solve the problems that the deposition can not be performed with a high precision since a metal mask can not intimately be contacted to a substrate due to a welding flash, the present invention is characterized in that a protrusion of the welding flash becomes less by a depth of the concave part or the welding flash will not be protruded from a surface of the mask because the flash is hidden within the concave part, through the means of forming the concave part within the welding portion of the metal mask and welding them within the concave part. Further, it becomes possible to perform the welding with less power as compared with the welding in which the mask having an ordinary thickness is welded as it is, and the protrusion of the welding flash will be still further minimized due to an ability to reduce the amount of the flash produced. In addition, performing the welding at the thinner portion within the concave part results in less welding error.

The formation of the concave part can be performed by mechanically cutting the mask to form a counter bore (spot facing), in case of which it is preferable to perform the cutting before an opening (a slit) which becomes a deposition pattern is formed on the mask. Further, after the cutting, the protrusion such as the flash being produced during the cutting is also eliminated when the chips are removed. Also, etching can be used as a method for forming the concave part, and both of the wet-etching and the dry-etching can be used. In particular, half-etching can be performed simultaneously with the etching which is conducted when the opening is formed as a deposition pattern of the mask. Such an etching is frequently used because this technique may result in the formation of the opening with high precision by performing the etching on both sides of the mask at two different times, among others, the half-etching may be simultaneously conducted when the opposite surface to be contacted to the frame (a surface to be contacted to the substrate to be deposited) is etched.

Although the depth of the concave part depends on the thickness of the metal mask or the welding method, a problem concerning the resistance to breakage can be resolved by making the thickness of the mask 10 μm or more as a thickness which remains after forming the concave part even when the tension is applied to the mask for welding them. A lower limit of the depth of the concave part may be such that the protrusion of the welding flash becomes the depth of 40 μm or less. Preferably, the depth is desirable to be made such that the welding flash is not protruded (that is, the height of the welding flash from the surface of the mask becomes zero).

Generally in performing the deposition, as for a gap which is acceptable between the metal mask and the substrate, an deposition incidence angle is defined so that the deposition pattern can be formed with the highest precision, that is, the deposition incidence angle is defined so that the pattern is barely blurred. Specifically, taking the manufacture of a QVGA (320×240 pixels) color organic EL display which is under development as an example, ITO (indium-tin oxide film) electrodes having a pattern pitch of 120 μm and a pattern width of 80 μm are formed on a substrate, a mask is set on the surface on which the ITOs are formed, an evaporation source having a diameter of 1 mm is placed apart from a center of the substrate by 40 mm, and the height of the substrate is set 500 mm above the evaporation source, the substrate being rotated to perform the deposition. In this case, an end of the deposition area is about 60 mm apart from the center of the substrate, and a deposition pattern shapes formed at the ends of the deposition area one of which is at the farthest end of the deposition area from the evaporation source and the other of which is at the nearest end of the deposition area from the evaporation source are different. Under such an condition, the inventors have investigated that how the corresponding situation between the uniform portion of the deposition pattern and the ITO electrode varies depending on the gap between the metal mask and the substrate. The ITO electrode and the uniform portion of the luminescent layer are correspond to each other if a value obtained by subtracting a pattern shift from a half-band width of the uniform portion of the luminescent layer is larger than a half-band width of the ITO pattern. When the gap is 40 μm, the uniform portion and the ITO electrode are corresponding to each other since the length of the uniform portion is about 92.1 μm and the pattern shift from the ITO electrode becomes 6 μm, but when the gap becomes larger than this, the pattern shift also increases and they can be no more correspond to each other. Therefore, the present invention defines the height of the protrusion of the welding flash so as to be up to 40 μm. Although this value certainly varies depending on a position of the evaporation source, a height of the substrate from the evaporation source, and a deposition area, the pattern shift becomes larger when the height of the substrate becomes lower and the position of the evaporation source is set at a further region. Conversely, it becomes difficult to form a uniform film when the height of the substrate becomes higher and the position of the evaporation source is set at the center of the substrate. Therefore, in the QVGA panel, this value of 40 μm is currently a maximum acceptable value in order to achieve a numerical aperture=60% at an aspect ratio 1:1.

The width of the concave part may be set larger than the area required for welding, but it has a possibility to be in danger of decreasing its mechanical strength, so that the width may be set slightly larger than the welding area. Further, welding can be performed at a plurality of portions as long as they are within the concave part, and in such a case, the width of concave part can be set larger without any problem. For example, in case of laser welding having a spot diameter of 0.5 mmφ, the width may be about 0.6 to 1.0 mm. On the other hand, the length depends on how the welding is performed, but a continuous groove may be formed in case of performing a continuous seam welding, and a continuous groove or a discontinuous groove which can cover the spot portion may be formed (either a circular shape or a rectangular shape may be utilized as a plan shape) in case of welding by a spot. A cross-section shape of the concave part should not be limited to a rectangular shape as shown in FIG. 1, any of a polygonal shape and a semicircular shape may be utilized.

As the metal mask in the present invention, such as stainless steel (SUS alloy), KOVAR (Fe—Ni—Co alloy) and invar (Fe—Ni alloy) generally used in the art can be used, but not limited thereto.

As a frame to which a metal mask is secured, any material can be used provided that the material can be welded to the metal mask and has sufficient rigidity. Further in the present invention, it is preferable to apply tension when the metal mask is secured. When the tension is applied, the shape of the opening can be maintained more robust by applying much tension along the longitudinal direction of the opening (slit) formed on the metal mask. Further, it is preferable to use a frame material the coefficient of the thermal expansion of which is the same as or higher than that of the metal mask, in order to prevent the looseness from occurring during the deposition due to the difference of the coefficient of the thermal expansion between the metal mask and the frame. Although the frame may be formed of a piece of material, it is possible to constitute the frame by using different materials for an outer rim portion and a beam portion or for a longitudinal rim and a cross beam respectively so that the tension is applied to the mask in a predetermined direction due to the difference of the thermal expansion caused by radiation heat during the deposition.

A thickness of the frame is not particularly limited as long as the metal mask can be maintained without being deflected and the thickness cannot absolutely be defined because it depends on the material to be used. However, it is important to make the thickness appropriate because the too large thickness results not only in the increase in the weight of the mask structure but also in the increase in work load such as opening the window, so that the frame may become a shield against the deposition when performing the deposition. The thickness is usually sufficient to have several millimeters to several tens of millimeters in case of the materials used for this application.

The frame can be formed by performing such as a cutting process or a punching process on a sheet of plate in order to provide a window as an opening of the deposition pattern part of the metal mask or can be formed by combining some bars to form the window. In order to enhance the smoothness of the metal mask, it is desirable to perform mirror grinding on the surface.

Attachment of the metal mask to the frame is performed by welding, and any method such as an electric resistance welding (including a spot welding), an electron beam welding, and a laser welding can be available. The laser welding among others is preferable because fine processing is easily performed and the height of the welding flash becomes lower.

In performing the deposition, the substrate to be deposited such as a glass substrate and the metal mask secured to the frame are intimately contacted to each other by performing the alignment at a surface of the metal mask to which the frame is attached and an opposite surface of the above described surface, but the gap may be created because the peripheral portion of the substrate is warped due to the application of the stress on the substrate caused by the radiation heat or deposits during the deposition as the substrate becomes thinner. In such a case, ferromagnetic materials are selected for the metal mask, a magnet is set on a surface of the substrate which is an opposite side of a surface to be contacted to the metal mask, and the metal mask is allowed to intimately contact the substrate by a magnetic force, so that the warping of the substrate can be prevented by a suction force between the magnet and the metal mask.

The present invention describes a deposition mask for forming an organic EL device but is not limited to this application, and it is needless to say that the present invention can be applied to any uses in which fine deposition patterns are formed.

The present invention will now be specifically described by way of example, but this invention is not limited to these examples.

EXAMPLE 1

In this example, a mask for isolating an organic EL luminescent layer is described.

Figure 1B:
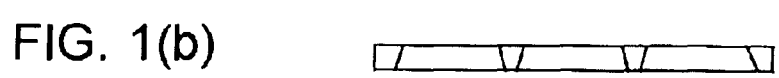

Firstly as shown in FIGS. 1(a) and 1(b), nine windows 11a for mask patterning, each of which has a size of 100×120 mm, were cut into a plate made of SUS 304 having a size of 400×400 mm and t=5 mm in order to obtain a metal mask frame 11, followed by performing mirror finish.

Figure 1C:
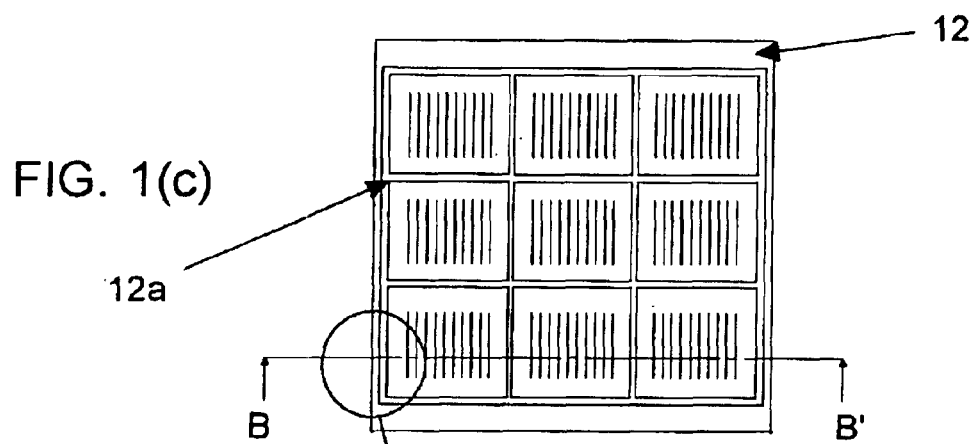
Figure 1D:
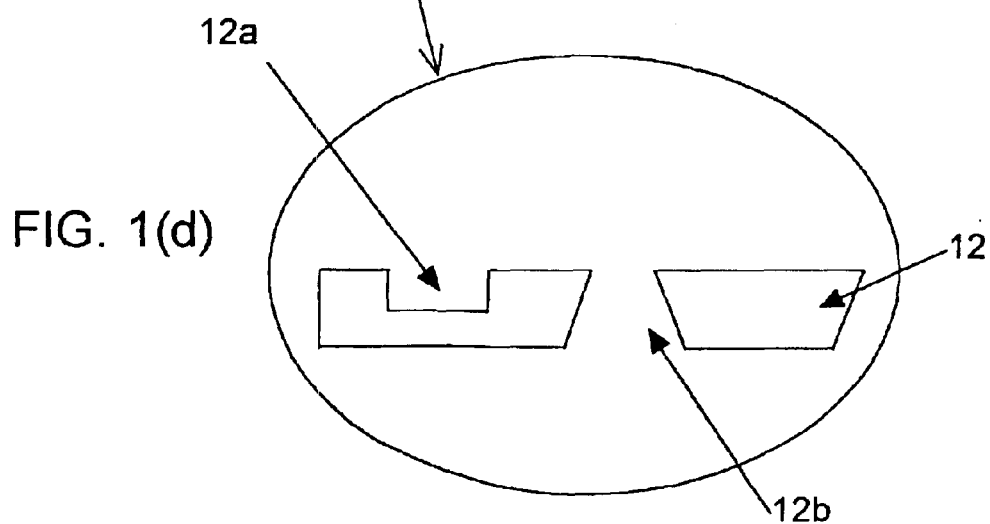

On the other hand, as shown in FIGS. 1(c) and 1(d), 320 slits 12b were patterned on a plate of SUS 304 having an outer size of 400×400 mm and t=100 μm by wet-etching in order to obtain a metal mask 12, in such a way that the slits with 360 μm pitches and with the slit width of 80 μm corresponded to the window portions of the above described frame. In addition, a concave part 12a at a welding portion was formed by cutting a surface which contacts a glass substrate in such a way that the cutting portion becomes a groove having a depth of 50 μm and a width of 1 mm.

In performing the welding, as shown in FIGS. 2(a) and 2(b), the metal mask 12 is aligned with the metal mask frame 11 with tension applied to the metal mask 12 in order to prevent the slack from occurring in the metal mask 12, then the laser beam 21 is allowed to converge into the concave part 12a of the metal mask 12 to weld the metal mask 12 and the metal mask frame. This welding was performed under the YAG laser spot welding conditions: a spot diameter=φ0.5 mm, an output=several tens of mJ, and a welding interval=1 mm. As shown in FIG. 2(b), although a welding flash 13 the height of which was up to 20 μm could be seen in the concave part 12a, this welding flash 13 did not protrude from the surface of the mask because the depth of the groove was 50 μm.

EXAMPLE 2

In this example, the manufacture of a metal mask for cathode isolation is described.

Nine windows for mask patterning each of which has a size of 120×100 mm were firstly cut into a plate of invar material ($Fe_{65}Ni_{35}$) having an outer size of 400×400 mm and t=5 mm in order to obtain a metal mask frame, followed by performing mirror finish.

On the other hand, 240 slits were patterned on a plate of SUS 304 having an outer size of 400×400 mm and t=100 μm by wet-etching in order to obtain a metal mask, in such a way that the slits with 360 μm pitches and with the slit width of 260 μm corresponded to the window portions of the above described frame. In addition, a concave part at a welding portion was formed by half-etching a surface which contacts a glass substrate, in such a way that the half-etching portion becomes a groove having a depth of 30 μm and a width of 0.8 mm.

In performing the welding, the metal mask is welded to the metal mask frame in such a way that the tension is applied to the metal mask in order to prevent the slack from occurring in the metal mask as in the case of Example 1. This welding was performed under the YAG laser spot welding conditions (seam welding, a spot diameter=φ0.5 mm, an output=several tens of mJ). Although a welding flash the height of which was up to 20 μm could be seen within the groove, this welding flash did not protrude from the surface of the mask because the depth of the groove was 30 μm.

Fabrication Example of the Device

Indium tin oxide (ITO) as anodes 32 was deposited to a thickness of 100 nm on a glass substrate 31 which is a 1737 glass having a thickness of 1.1 mm from Corning Co., LTD., and the glass substrate with the ITO electrodes was obtained.

The ITO transparent electrode film deposited on the glass substrate 31 was made into 960 stripes of anodes 32 each of which has a line width of 0.08 mm and a pitch of 0.12 mm by using the photolithography and wet etching. After the patterns were formed, the ITO substrate was washed with an organic solvent, then performing UV/ozone cleaning. Next, an organic film was formed on the ITO electrodes. As a hole transporting layer 33, a vacuum evaporator containing a crucible in which an organic material N,N'-diphenyl-N,N'-bis(α-naphtyl)-1,1'-biphenyl-4,4'-diamine (referred to as α-NPD hereinafter) is placed was evacuated to 1.33 mPa ($1×10^{-5}$ Torr) or less by an vacuum pump, then the organic material was uniformly deposited on the ITO electrodes 32.

Figure 3A:
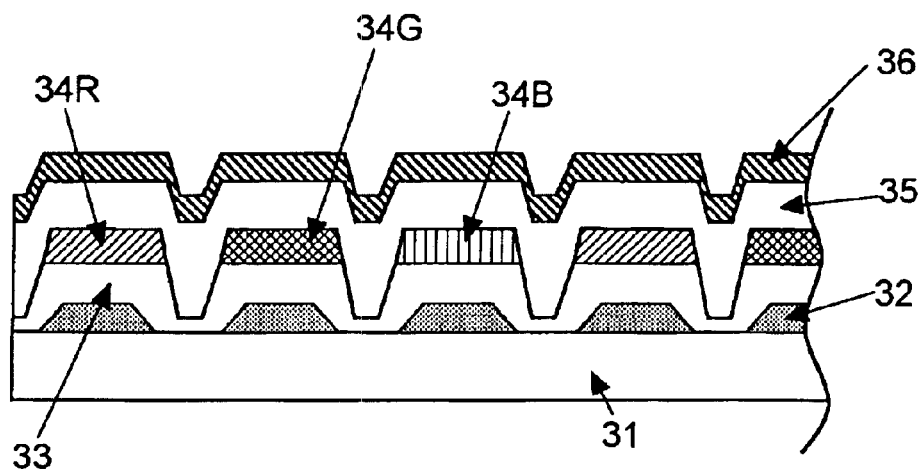
Figure 3B:
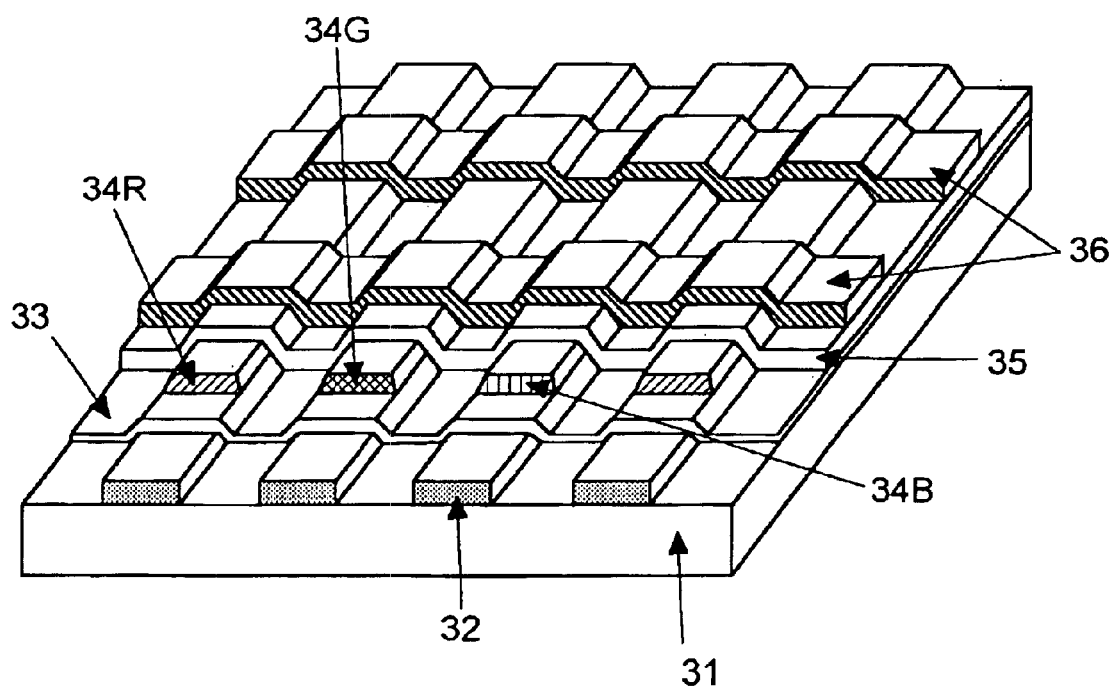
Figure 4A:
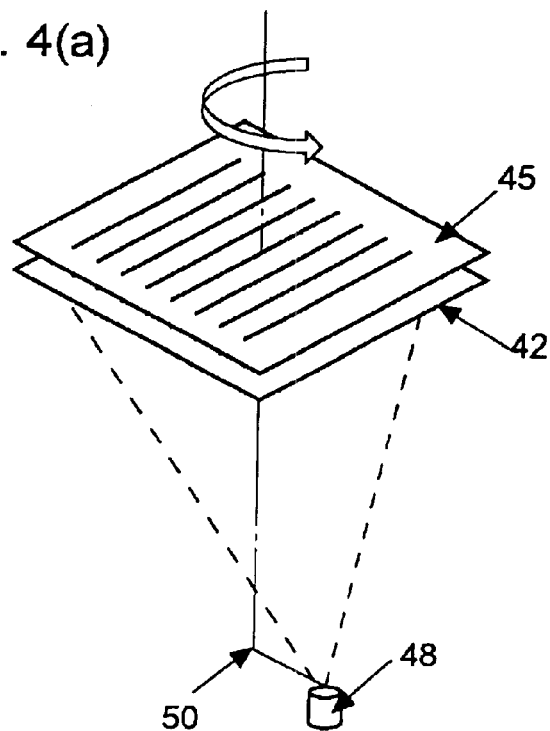
Figure 4B:
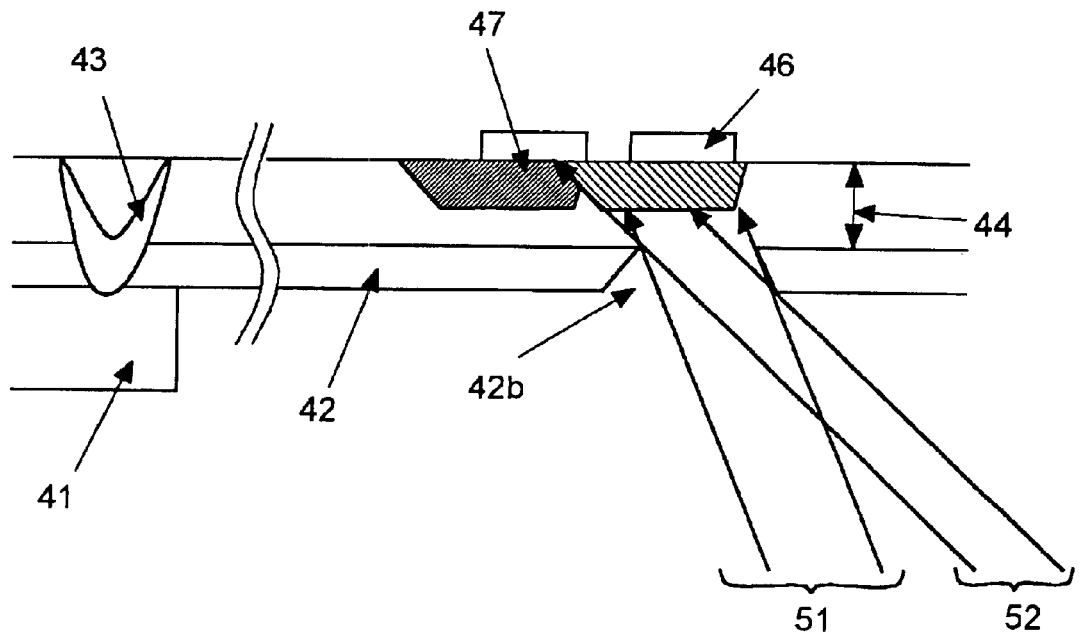

After the hole transporting layer 33 was formed, using a metal mask for isolating an organic luminescent layer (the mask which was fabricated in Example 1) with a pitch of three times that of the stripe patterns of the ITO electrodes 32 and with a slit width of 0.08 mm, the glass substrate 31 was placed such that it intimately contacted the metal mask, and a red luminescent layer 34R, a green luminescent layer 34G, and a blue luminescent layer 34B were formed by a shadow mask method on the ITO electrodes 32 in parallel with the electrodes each of which was formed like a stripe. Firstly, as a red luminescent layer 34R, tris(8-quinolilite) aluminum complex (referred to as $Alq_3$ hereinafter) containing 4-dicyanomethylene-2-methyl-6-(p-dimethylaminostyryl)-4Hpyran as a dopant (DCM, doping concentration of 5 wt %) was co-deposited to a thickness of 50 nm. After the mask was displaced by the same pitch as the ITO electrode, as a green luminescent layer 34G, $Alq_3$ containing quinacridone as a dopant (doping concentration of 5 wt %) was co-deposited to a thickness of 50 nm, and after the mask was slid by the same pitch as the ITO electrode, perylene was deposited to a thickness of 50 nm as a blue luminescent layer 34B. The luminescent layers were thus formed. Next, $Alq_3$ was uniformly deposited to a thickness of 50 nm as an electron transporting layer 35. All of these processes were consistently conducted in a vacuum. Finally, stripe-like cathodes 36 orthogonal to the stripes of the ITO electrodes 32 and the luminescent layers are formed on the electron transporting layers 35. Formation of the electrodes are performed by using the above described metal mask for cathode isolation (a mask fabricated in Example 2) such that the glass substrate is intimately contacted to the metal mask, and by conducting a shadow mask method. The cathode material used at this time is an alloy of Al and Li, the alloy being binary deposited such that a ratio of Al:Li becomes 10:1. As described above, the EL device schematically shown in FIGS. 3(a) and 3(b) is completed.

Each luminescent layer which was deposited by using the metal mask according to the present invention had no blur in its pattern, and was well corresponded to the pattern of ITO electrode 32. In addition, as for the cathodes which were similarly deposited by using the metal mask according to the present invention, a short-circuit could not be seen between the adjacent electrodes.

COMPARATIVE EXAMPLE 1

A metal mask was welded to a frame as in the case of Example 1 or 2 except that a concave part was not provided to the welding portion. An EL device was formed by using this mask as in the case of the above described manufacturing example, but color mixture can be seen in the luminescent layers which were adjacent each other and a part of the cathode was shorted out.

What is claimed is:

1. A metal mask structure for depositing a thin layer, comprising:

a metal mask having a concave part formed in a first surface which comprises the opposite side of a frame-contacting surface; and a support frame welded to the metal mask such that it contacts the frame-contacting surface;

wherein the metal mask and the support frame are welded to each other within the concave part.

2. The metal mask structure according to claim 1, wherein a depth of the concave part which is formed in the metal mask is such that a protrusion of a welding flash formed on the first surface of the metal mask is within a range from 0 to 40 μm after welding.

3. The metal mask structure according to claim 2, wherein the metal mask is secured with tension applied thereto when the metal mask is secured to the support frame.

4. The metal mask structure according to claim 2, wherein the concave part is a continuous groove.

5. The metal mask structure according to claim 2, wherein the concave part has a circular or rectangular shape as a plane shape.

6. The metal mask structure according to claim 1, wherein the metal mask is secured with tension applied thereto when the metal mask is secured to the support frame.

7. The metal mask structure according to claim 1, wherein the concave part is a continuous groove.

8. The metal mask structure according to claim 1, wherein the concave part has a circular or rectangular shape as a plane shape.

9. A method for manufacturing a metal mask structure, comprising:

forming a concave part in a first surface of a metal mask which comprises the opposite side of a frame-contacting surface; and welding a support frame to the metal mask such that the metal mask and the support frame are in contact along the frame-contacting surface and are welded to each other within the concave part.

10. The method for manufacturing the metal mask structure according to claim 9, wherein the concave part is formed through cutting.

11. The method for manufacturing the metal mask structure according to claim 9, wherein the concave part is formed through etching.

12. The method for manufacturing the metal mask structure according to claim 9, wherein a deposition opening pattern formed in the metal mask is realized by wet-etching which is performed on both sides of the mask at two different times, said concave part being simultaneously formed when the first surface of the mask is etched.

13. The method for manufacturing the metal mask structure according to claim 9, wherein a depth of the concave part which is formed in the metal mask is such that a protrusion of a welding flash formed on the first surface of the metal mask is within a range from 0 to 40 μm after welding.

14. The method for manufacturing the metal mask structure according to claim 9, wherein the metal mask is secured with a tension applied thereto when the metal mask is secured to the support frame.

15. The method for manufacturing the metal mask structure according to claim 9, wherein the welding of the metal mask and the support frame is performed through laser welding.

* * * * *